(12) United States Patent
Teng et al.

(10) Patent No.: US 10,797,638 B2
(45) Date of Patent: Oct. 6, 2020

(54) PLANAR SOLAR CONCENTRATOR

(71) Applicant: National Taiwan Normal University, Taipei (TW)

(72) Inventors: Tun-Chien Teng, Taipei (TW); Chih-Hsuan Kuo, Taipei (TW); Yu-Jia Zheng, New Taipei (TW)

(73) Assignee: NATIONAL TAIWAN NORMAL UNIVERSITY, Taipei (TW)

( * ) Notice: Subject to any disclaimer, the term of this patent is extended or adjusted under 35 U.S.C. 154(b) by 0 days.

(21) Appl. No.: 16/656,263

(22) Filed: Oct. 17, 2019

(65) Prior Publication Data

US 2020/0244217 A1 Jul. 30, 2020

(30) Foreign Application Priority Data

Jan. 25, 2019 (TW) .............................. 108102845 A

(51) Int. Cl.
| | |
|---|---|
| *H02S 40/22* | (2014.01) |
| *F21V 8/00* | (2006.01) |
| *G02B 19/00* | (2006.01) |
| *F24S 23/00* | (2018.01) |
| *H01L 31/054* | (2014.01) |
| *G05D 3/10* | (2006.01) |

(52) U.S. Cl.
CPC .............. *H02S 40/22* (2014.12); *F24S 23/12* (2018.05); *G02B 6/0023* (2013.01); *G02B 6/0053* (2013.01); *G02B 6/0088* (2013.01); *G02B 19/0009* (2013.01); *G02B 19/0042* (2013.01); *H01L 31/0547* (2014.12); *G05D 3/105* (2013.01); *Y02E 10/52* (2013.01)

(58) Field of Classification Search
None
See application file for complete search history.

(56) References Cited

U.S. PATENT DOCUMENTS

| | | | | |
|---|---|---|---|---|
| 7,873,257 B2* | 1/2011 | Morgan | .................... | F21S 11/00 385/146 |
| 2008/0202500 A1* | 8/2008 | Hodges | .................... | F24S 23/30 126/684 |
| 2009/0064993 A1* | 3/2009 | Ghosh | ...................... | F24S 23/12 126/685 |
| 2011/0226332 A1* | 9/2011 | Ford | ..................... | G02B 3/0037 136/259 |
| 2012/0006382 A1* | 1/2012 | Dagli | ................. | G02B 19/0028 136/246 |
| 2016/0299325 A1* | 10/2016 | Teng | .................... | H01L 31/0547 |
| 2017/0115473 A1* | 4/2017 | Kozodoy | ............ | H01L 31/0547 |

* cited by examiner

*Primary Examiner* — Michael Stahl
(74) *Attorney, Agent, or Firm* — Birch, Stewart, Kolasch & Birch, LLP

(57) ABSTRACT

A planar solar concentrator includes a light collecting assembly and a light condensing unit. The light collecting assembly includes a light collecting unit and a waveguide slab extending in a longitudinal direction. The light collecting unit includes a light collector having an input surface, an output surface, and a curved surface to direct an incident light toward a collecting zone on the output surface. The light condensing unit is slidably coupled to a rear end of the waveguide slab for condensing the incident light from the waveguide slab, and is coupled such that based on an elevation angle of the light source, the light condensing unit is permitted to be driven to slide in a transverse direction.

11 Claims, 14 Drawing Sheets

PLANAR SOLAR CONCENTRATOR

CROSS-REFERENCE TO RELATED APPLICATION

This application claims priority from Taiwanese Invention Patent Application No. 108102845, filed on Jan. 25, 2019.

FIELD

The disclosure relates to a solar energy harvesting system, more particularly to a planar solar concentrator.

BACKGROUND

Conventional solar concentrators are disclosed in (1) J. H. Karp et al., "Planar micro-optic solar concentrator," Optics Express (2010), vol. 18, no. 2, pages 1122-1133; (2) Y. Liu et al., "Design of a lens-to-channel waveguide system as a solar concentrator structure," Optics Express (2014), vol. 22, no. s2, pages A198-A204; (3) O. Selimoglu et al., "Exploration of the horizontally staggered light guides for high concentration CPV applications," Optics Express (2012), vol. 20, no. 17, pages 19137-19147; and (4) T. C. Teng et al., "Planar solar concentrator featuring alignment-free total-internal-reflection collectors and an innovative compound tracker," Optics Express (2014), vol. 22, no. s7, pages A1818-A1834.

U.S. Pat. No. 7,873,257 B2 discloses a conventional solar energy system that uses a light-guide solar panel (LGSP) to trap light inside a dielectric or other transparent panel and propagates the light to one of the panel edges for harvest by a solar energy collector such as a photovoltaic cell. This allows for very thin modules whose thickness is comparable to the height of the solar energy collector. This eliminates the depth requirements inherent in traditional concentrated photovoltaic solar energy systems.

SUMMARY

An object of the disclosure is to provide a novel planar solar concentrator in which a light condensing unit is permitted to be driven to slide based on an elevation angle of a light source.

According to the disclosure, a planar solar concentrator includes a light collecting assembly and a light condensing unit. The light collecting assembly includes a light collecting unit and a waveguide slab. The light collecting unit includes a light collector having an input surface, an output surface, and a curved surface. The input surface is disposed for receiving an incident light from a light source. The output surface is opposite to the input surface in an upright direction. The curved surface extends to interconnect the input and output surfaces, and has a curvature to direct the incident light toward a collecting zone on the output surface. The waveguide slab extends in a longitudinal direction to terminate at a rear end segment and a front end segment which is coupled to the collecting zone so as to permit the incident light to be introduced into the waveguide slab. The waveguide slab is configured to permit the incident light from the light collector to be directed toward a rear end surface of the rear end segment. The waveguide slab further extends in a transverse direction relative to the longitudinal direction. The light condensing unit is slidably coupled to the rear end surface, and is configured for condensing the incident light from the waveguide slab. The light condensing unit is coupled such that based on an elevation angle of the light source, the light condensing unit is permitted to be driven to slide in the transverse direction.

BRIEF DESCRIPTION OF THE DRAWINGS

Other features and advantages of the disclosure will become apparent in the following detailed description of the embodiment(s) with reference to the accompanying drawings, in which.

DETAILED DESCRIPTION

Figure 1:
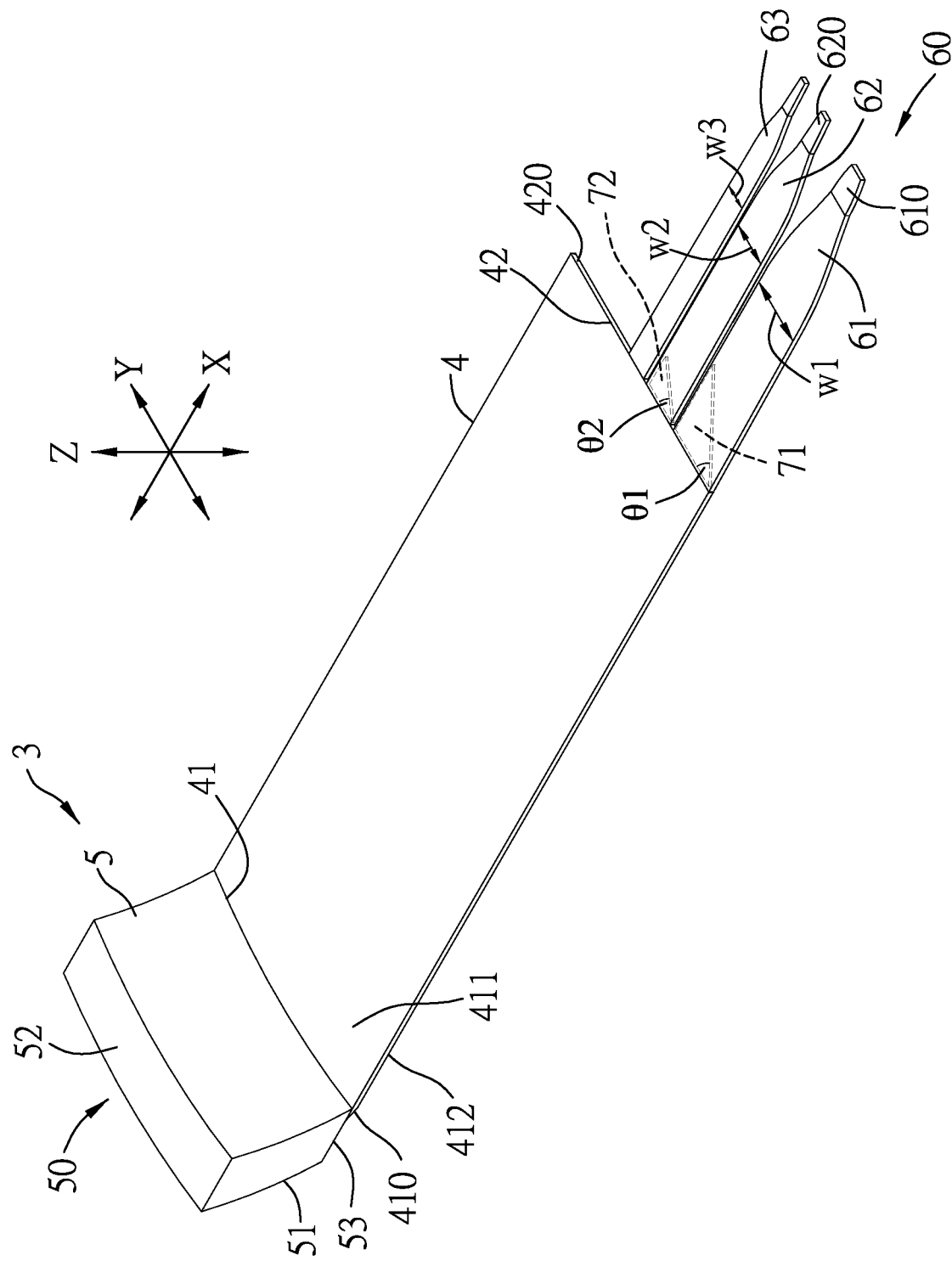
FIG. 1 is a perspective view of a first embodiment of a planar solar concentrator according to the disclosure.

Before the disclosure is described in greater detail, it should be noted that where considered appropriate, reference numerals have been repeated among the figures to indicate corresponding or analogous elements, which may optionally have similar characteristics.

To aid in describing the disclosure, directional terms may be used in the specification and claims to describe portions of the present disclosure (e.g., front, rear, left, right, top, bottom, etc.). These directional definitions are intended to merely assist in describing and claiming the disclosure and are not intended to limit the disclosure in any way.

Referring to FIGS. 1 and 4 to 6, a planar solar concentrator according to a first embodiment of the disclosure is shown to include a light collecting assembly 3 and a light condensing unit 60.

The light collecting assembly 3 includes a light collecting unit 50 and a waveguide slab 4. The light collecting unit 50 includes a light collector 5 having an input surface 52, an output surface 53, and a curved surface 51. The input surface 52 is disposed for receiving an incident light (L, L1, L2) from a light source, such as the sun. The incident light (L, L1, L2) enters the input surface 52 at an angle of incidence.

The output surface 53 is opposite to the input surface 52 in an upright direction (Z). The curved surface 51 extends to interconnect the input and output surfaces 52, 53, and has a curvature to direct the incident light (L, L1, L2) toward a collecting zone 531 (see FIG. 3) on the output surface 53.

Figure 2:
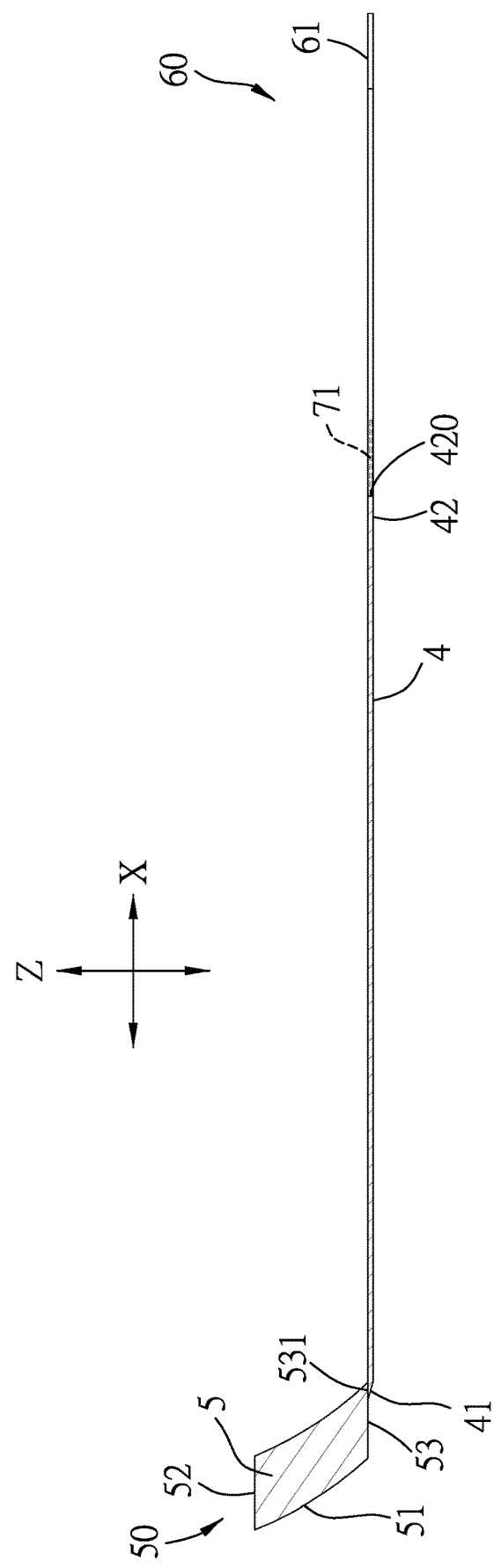
FIG. 2 is a partially cross-sectional view of FIG. 1.
Figure 4:
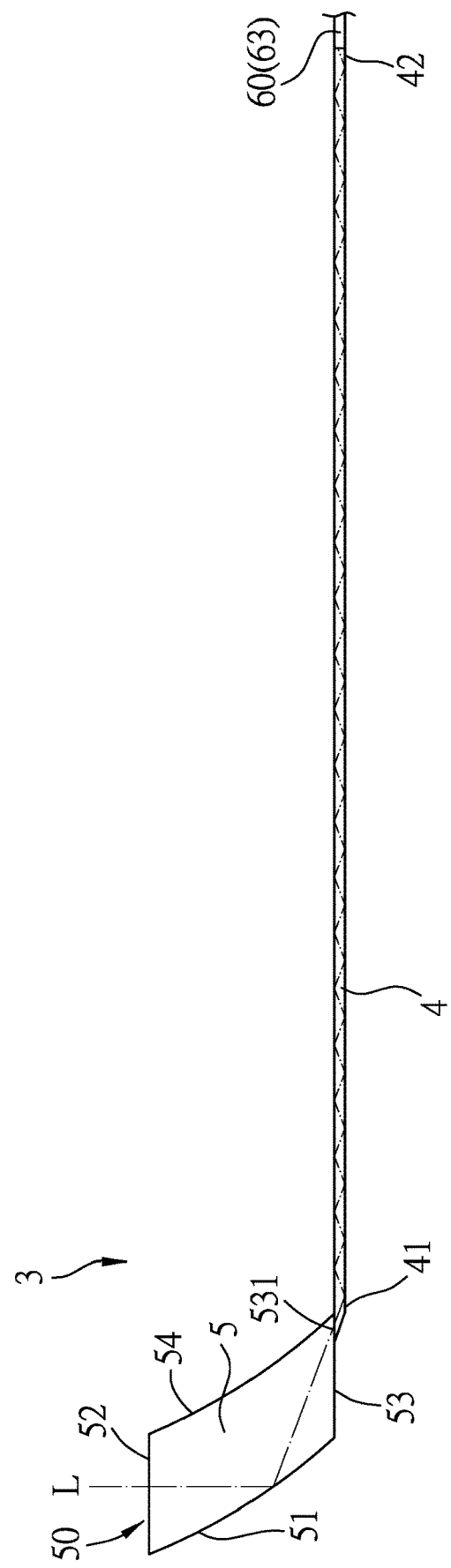
FIG. 4 is a schematic side view illustrating a light path in the planar solar concentrator of the first embodiment.

In an embodiment shown in FIGS. 2 and 4, the curved surface 51 is a parabolic total-internal-reflection (TIR) surface, and the light collector 5 has another curved surface 54 opposite to the curved surface 51. The curved surfaces 51, 54 cooperatively define a thickness, which may be 10 mm. The incident light (L, L1, L2) may be a solar light and is totally and internally reflected by the curved surface 51. Therefore, the light entering the light collector 5 is less likely to decouple from the planar solar concentrator.

The waveguide slab 4 extends in a longitudinal direction (X) to terminate at a front end segment 41 and a rear end segment 42, and further extends in a transverse direction (Y) relative to the longitudinal direction (X). The front end segment 41 is coupled to the collecting zone 531 so as to permit the incident light (L, L1, L2) to be introduced into the waveguide slab 4. The waveguide slab 4 is configured to permit the incident light (L, L1, L2) from the light collector 5 to be directed toward a rear end surface 420 of the rear end segment 42. The waveguide slab 4 has a length in the longitudinal direction (X) such that the light is focused on a focus point (P) at the rear end surface 420 (see FIG. 5) so as to facilitate the introduction of light into the light condensing unit 60. In an embodiment, the waveguide slab 4 has a thickness of 0.5 mm, and the length of the waveguide slab 4 is 88 cm.

Each of the light collecting unit 50 and the waveguide slab 4 is made of a light-transmissive material. In an embodiment, each of the light collecting unit 50 and the waveguide slab 4 is made of poly(methyl methacrylate) (index of refraction: 1.5).

Figure 3:
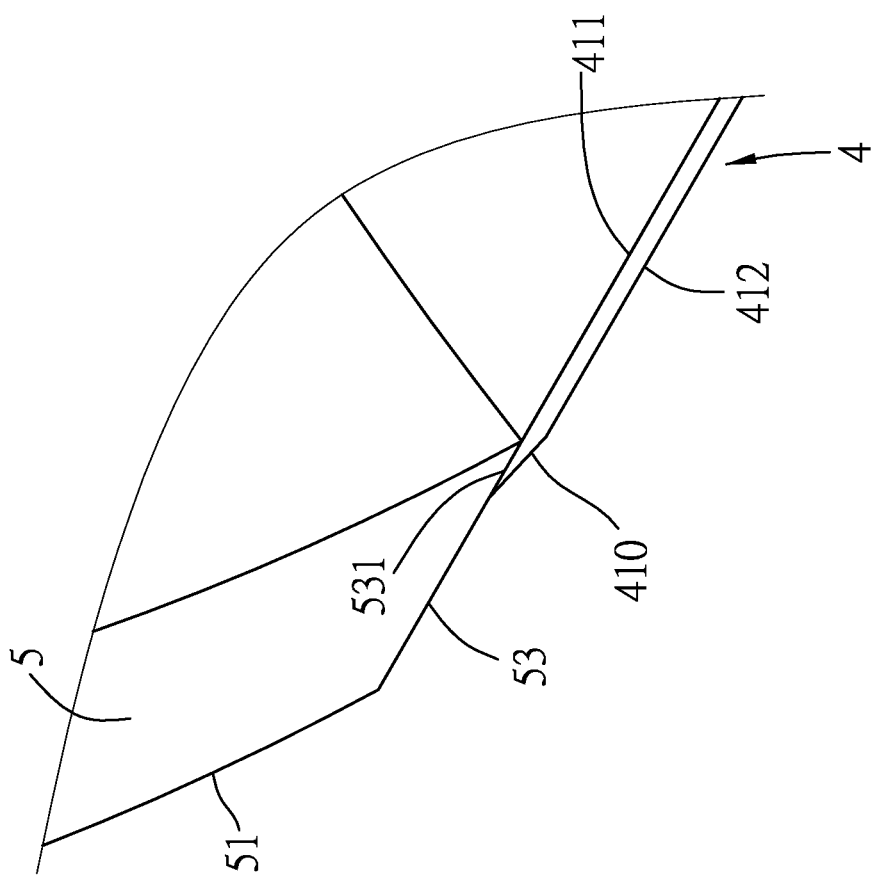
FIG. 3 is a fragmentary enlarged perspective view illustrating a front end of a light collecting assembly of the first embodiment.

In an embodiment shown in FIGS. 1 and 3, the waveguide slab 4 has an upper major surface 411 and a lower major surface 412 which are opposite to each other in the upright direction (Z). The front end segment 41 has a front end surface 410 which interconnects the upper and lower major surfaces 411, 412, and which is inclined relative to the upright direction (Z). An included angle between the upper major surface 411 and the front end surface 410 is an acute angle (for example, 12°), while an included angle between the lower major surface 412 and the front end surface 410 is an obtuse angle.

In an embodiment shown in FIGS. 2 and 4, the curved surface 51 is disposed forwardly of the front end segment 41.

The light condensing unit 60 is slidably coupled to the rear end surface 420, and is configured for condensing the incident light (L, L1, L2) from the waveguide slab 4. The light condensing unit 60 may be manually-driven to slide in the transverse direction (Y) or program-driven to automatically slide in the transverse direction (Y) based on an elevation angle of the light source (i.e., a variation of a solar elevation angle). The light condensing unit 60 is made of a light-transmissive material. In an embodiment, the light condensing unit 60 is made of poly(methyl methacrylate) (index of refraction: 1.5).

Figure 5:
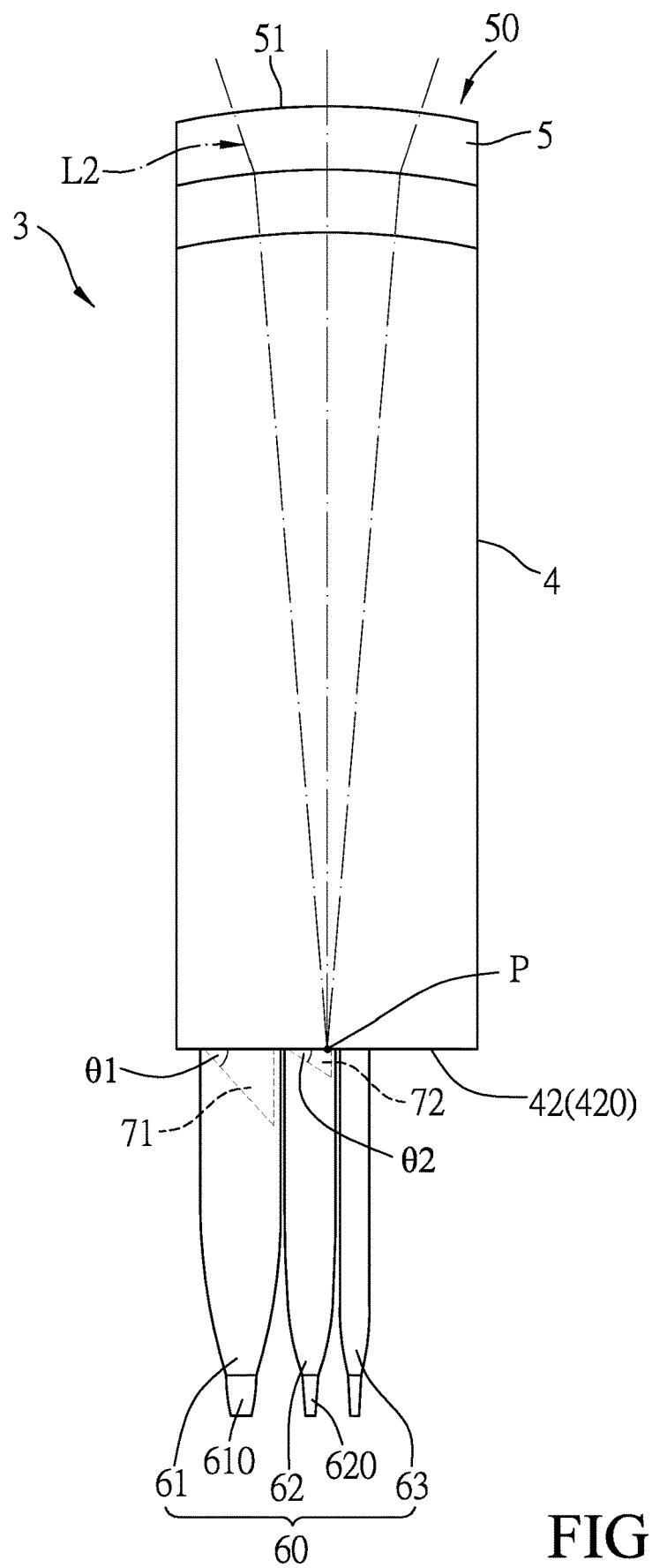
FIG. 5 is a schematic top view illustrating light paths in the planar solar concentrator of the first embodiment.
Figure 6:
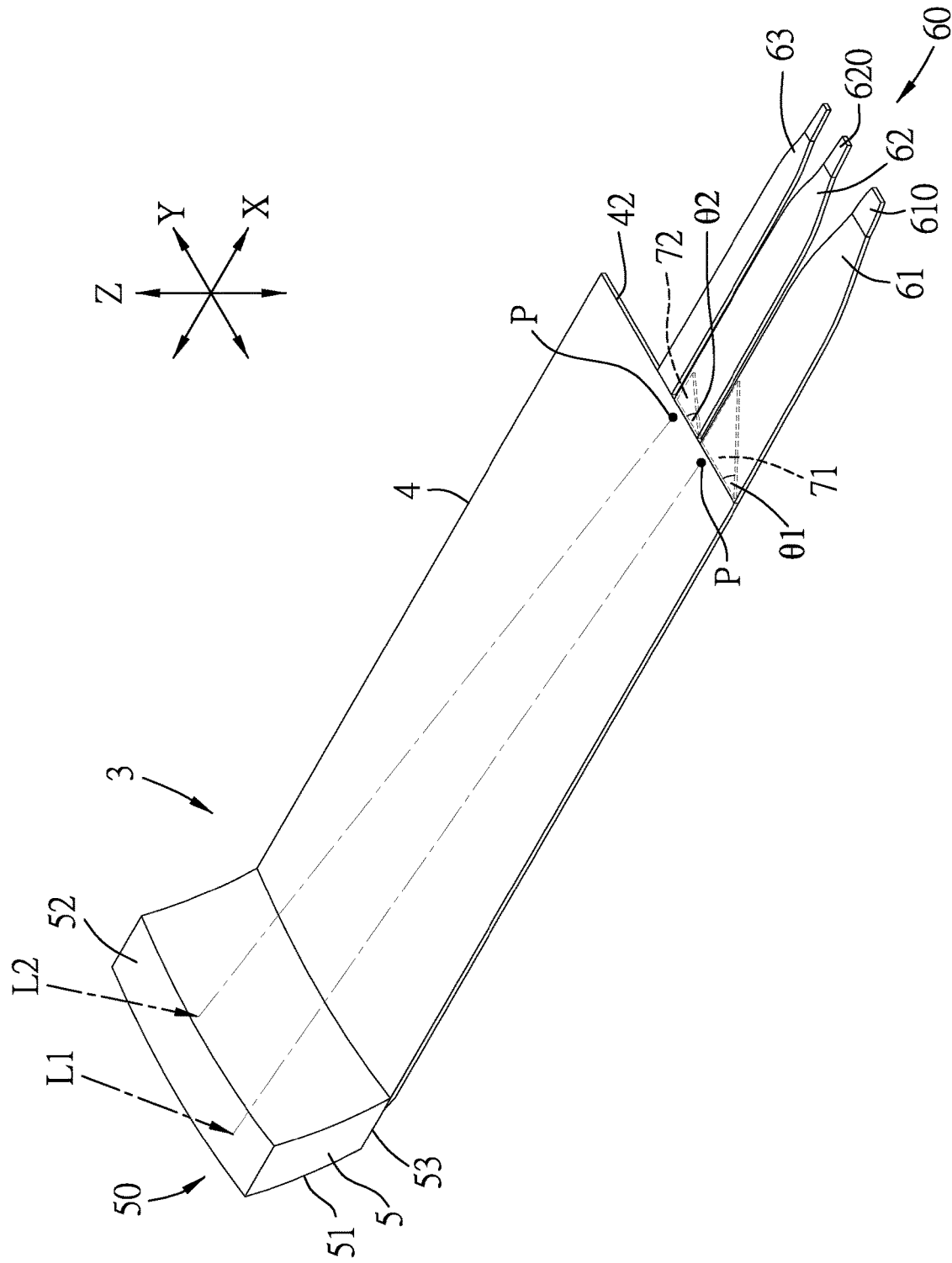
FIG. 6 is a perspective view illustrating different focus points obtained when light enters the planar solar concentrator at different angles of incidence.

In an embodiment shown in FIGS. 1, 5, and 6, the light condensing unit 60 includes a plurality of light condensers 61, 62, 63 which are displaced from each other in the transverse direction (Y), and which have different widths in the transverse direction (Y). The number of the light condensers may be varied based on design requirements.

In an embodiment shown in FIGS. 1, 5, and 6, each of the light condensers 61, 62, 63 is tapered rearwardly so as to condense the light toward a respective rear end thereof, to thereby enhancing a concentration ratio of the planar solar concentrator. In other words, each of the light condensers 61, 62, 63 is gradually reduced in thickness and width.

In an embodiment shown in FIGS. 1, 5, and 6, the light condensing unit 60 includes a first light condenser 61, a second light condenser 62, and a third light condenser 63 which have first, second, third widths (w1, w2, w3) in the transverse direction (Y), respectively. The second width (w2, e.g., 10.0 mm) is smaller than the first width (w1, e.g., 15.2 mm), and the third width (w3, e.g., 5.6 mm) is smaller than the second width (w2). As shown in FIG. 4, when the angle of incidence of the incident light (L) ranges from 0° to 7°, the light (L) is directed to the third light condenser 63. As shown in FIG. 6, when the angle of incidence of the incident light (L2) ranges from 7° to 14°, the light (L2) is directed to the second light condenser 62. When the angle of incidence of the incident light (L1) ranges from 14° to 24°, the light (L1) is directed to the first light condenser 61.

In an embodiment shown in FIGS. 1, 5, and 6, the planar solar concentrator further includes a first flat prism 71 and a second flat prism 72, which are respectively disposed inside the first and second light condensers 61, 62 in contact with or in proximity to the rear end surface 420, and which are configured to direct the incident light (L1, L2) from the waveguide slab 4 toward rear ends 610, 620 of the first and second light condensers 61, 62, respectively.

In an embodiment shown in FIGS. 1, 5, and 6, the first flat prism 71 has a prism angle θ1 of 48° and the second flat prism 72 has a prism angle θ2 of 33°. The first and second flat prisms 71, 72 may be made of sapphire and are in contact with the rear end surface 420.

Figure 14:
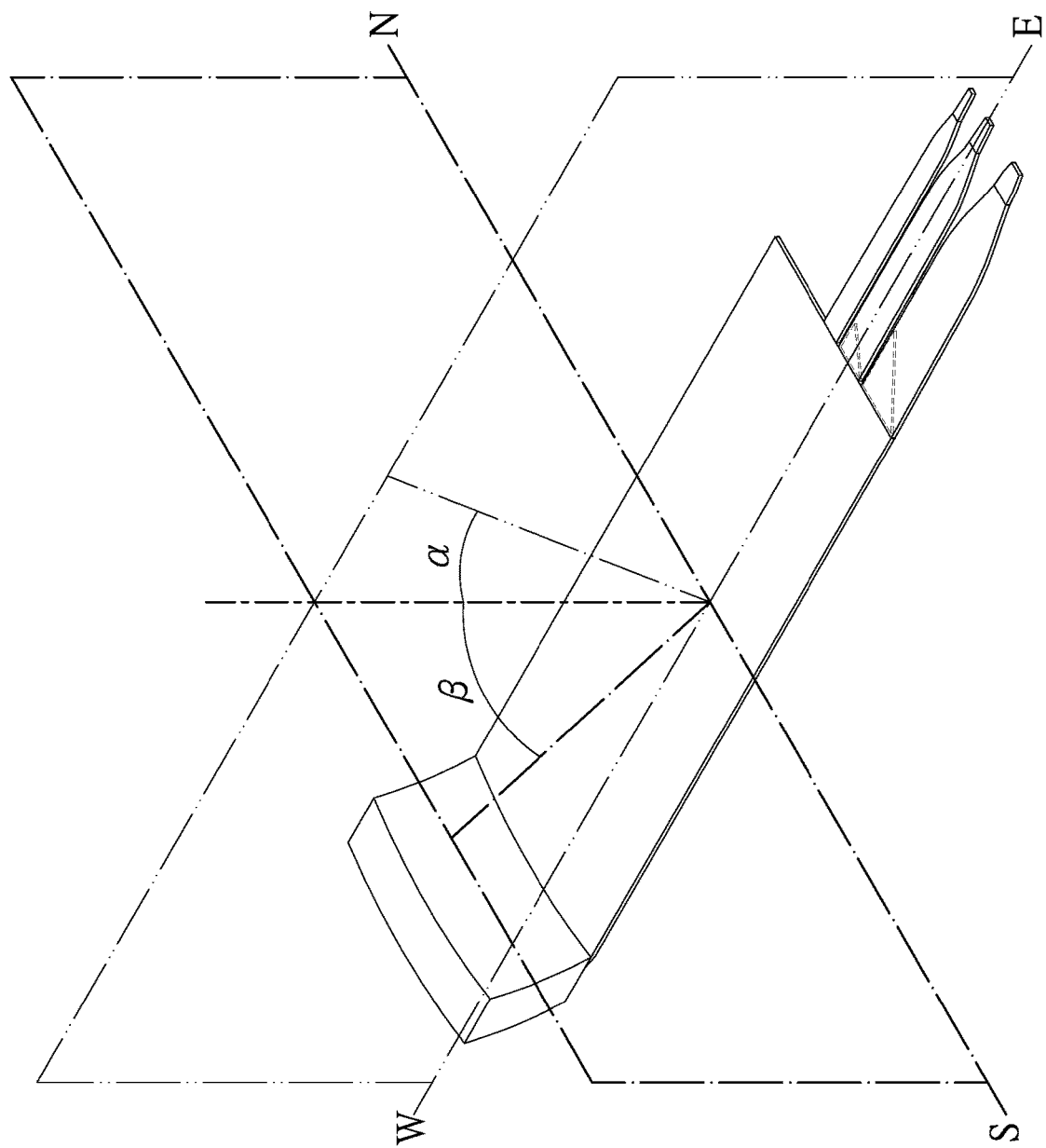
FIG. 14 is a perspective view illustrating incidence angles of sunlight to the planar solar concentrator shown in FIG. 1.

An application of the planar solar concentrator according to the first embodiment of the disclosure may be demonstrated by installing the concentrator at a latitude of 25.05° in Taipei. The concentrator is mounted on a single-axis tracker, a rotation axis of which is inclined relative to the ground by an angle corresponding to the latitude of the location. For example, in Taipei, the angle is 25.05°. The rotation axis is aligned with the north-south direction and rotates the concentrator to track the sun in real time as the sun rises and falls from the east to the west. As shown in FIG. 14, an incidence angle (α) of the sunlight to the concentrator is defined in a plane in the east-west direction, while an incidence angle (β) of the sunlight to the concentrator is defined in a plane in the north-south direction. When the concentrator is mounted on the single-axis tracker, the incidence angle (α) is kept constantly at 0°, but the incidence angle (β) is not always 0°. On the vernal or autumnal equinox, a normal of the concentrator is directed to the sun (i.e., both the incidence angles (α) and (β) of the sunlight to the concentrator are 0°). On the summer or winter solstice, the sun elevation angle relative to the concentrator is 66.5°, and the incidence angle (β) of the sunlight to the concentrator is −23.5° or +23.5°. Therefore, the light condensing unit 60 is driven to move correspondingly in the transverse direction (Y) so as to receive the sunlight entering the concentrator at the incidence angle (β) within the range of to +23.5°. In this embodiment, the longitudinal direction (X) of the planar solar concentrator is aligned with the east-west direction, and the transverse direction (Y) of the planar solar concentrator is aligned with the north-south direction. In other embodiments, the single-axis tracker may be replaced with a double-axis tracker.

Figure 7:
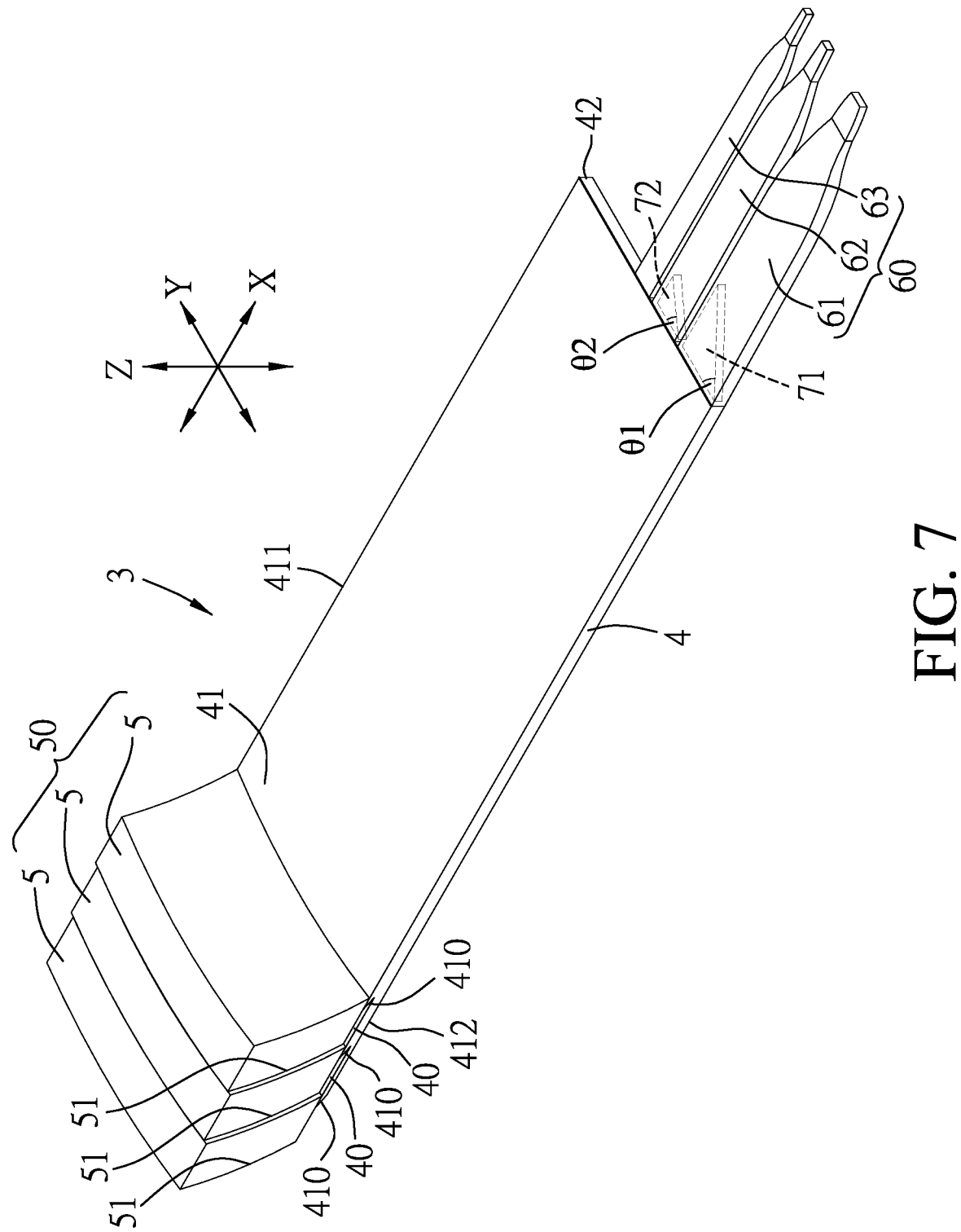
FIG. 7 is a perspective view of a second embodiment of a planar solar concentrator according to the disclosure.
Figure 8:
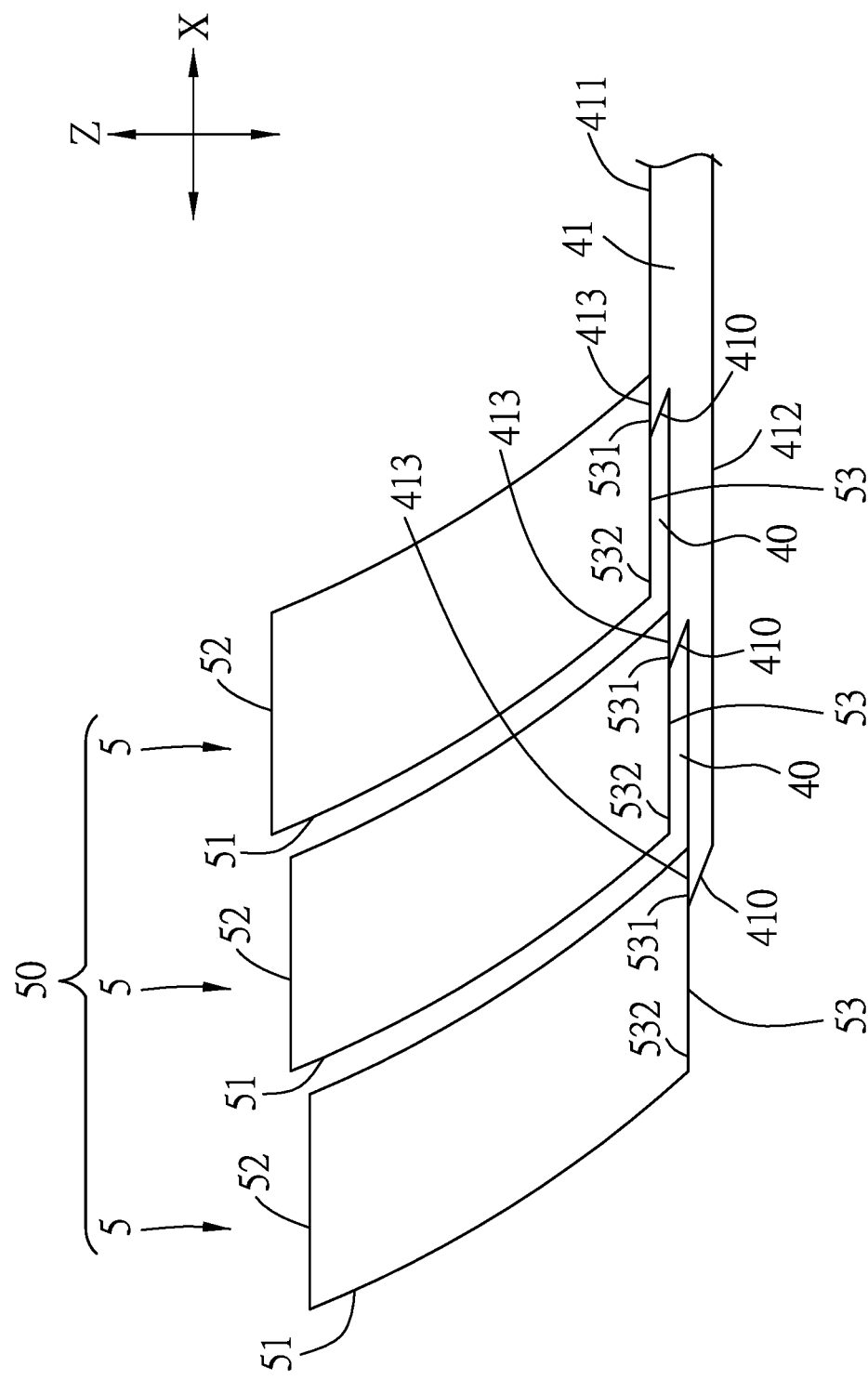
FIG. 8 is a fragmentary enlarged side view illustrating a front end of a light collecting assembly of the second embodiment.

FIGS. 7 and 8 illustrate a planar solar concentrator according to a second embodiment of the disclosure. The second embodiment is similar to the first embodiment, except that in the second embodiment, the front end segment 41 includes a plurality of first regions 413 which are displaced from each other in the longitudinal direction (X), and which are forwardly and downwardly stepped. Each of the first regions 413 has a front end surface 410 which is inclined relative to the upright direction. (Z).

In addition, the light collecting unit 50 includes a plurality of the light collectors 5. The collecting zones 531 of the output surfaces 53 of the light collectors 5 are respectively coupled to the first regions 413 of the front end segment 41 so as to permit the incident lights (L, L1, L2) entering the light collectors 5 to be introduced into the waveguide slab 4.

In an embodiment shown in FIG. 8, the light collecting unit 50 includes three of the light collectors 5, and a non-collecting zone 532 of the output surface of each of the light collectors 5 is not in contact with the front end segment 41 so as to prevent decoupling of the light from the waveguide slab 4. In this case, rear two of the light collectors 5 define two clearances 40 with the front end segment 41, respectively.

In an embodiment shown in FIG. 8, the curved surface 51 of each of the light collectors 5 is disposed forwardly of a respective one of the first regions 413.

Figure 9:
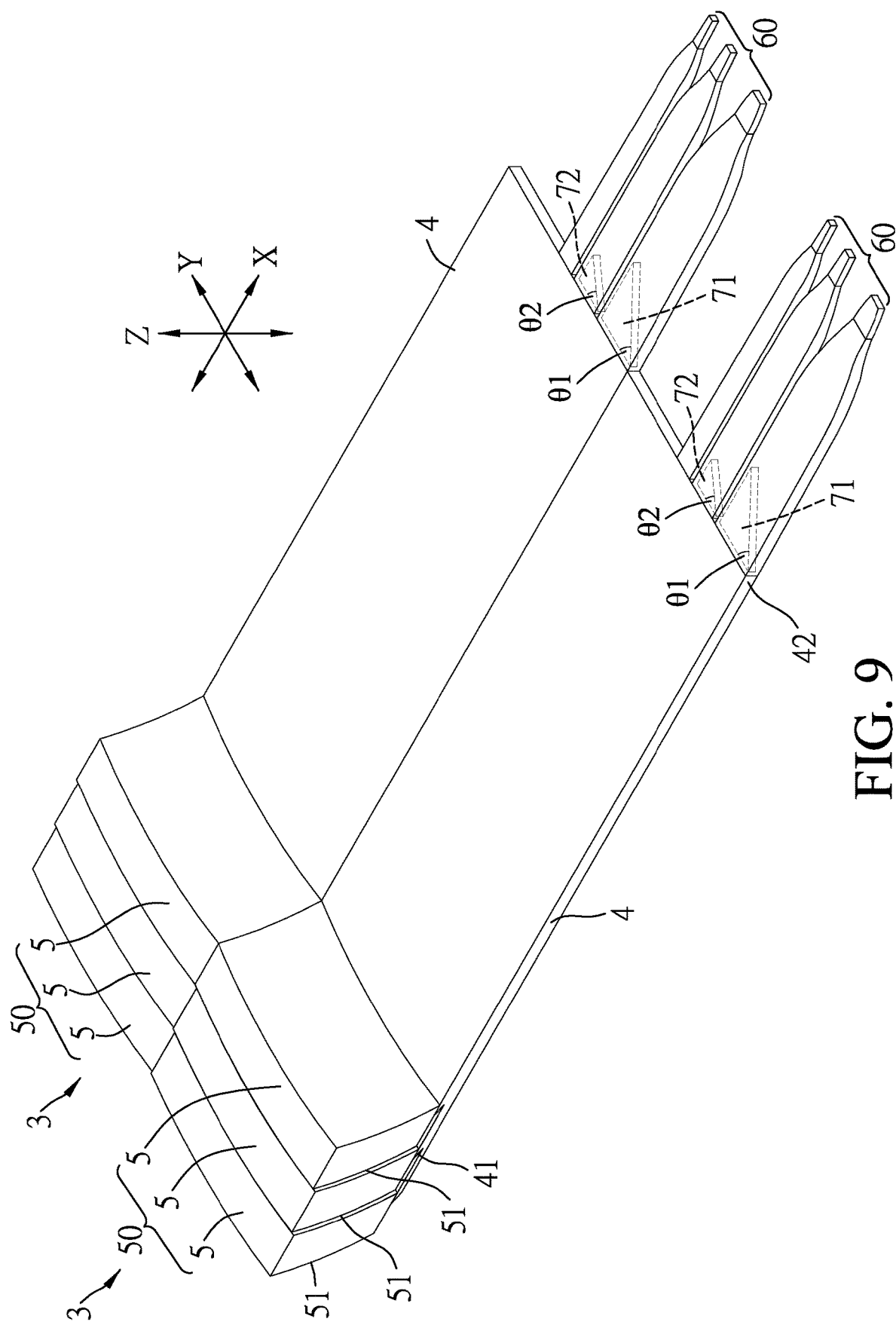
FIG. 9 is a perspective view illustrating two of the planar solar concentrators shown in FIG. 7 being juxtaposed.

In an embodiment shown in FIG. 9, two of the planar solar concentrators shown in FIG. 7 are juxtaposed in the transverse direction (Y). In other embodiments, three or more of the planar solar concentrators may be juxtaposed based on requirements.

Figure 10:
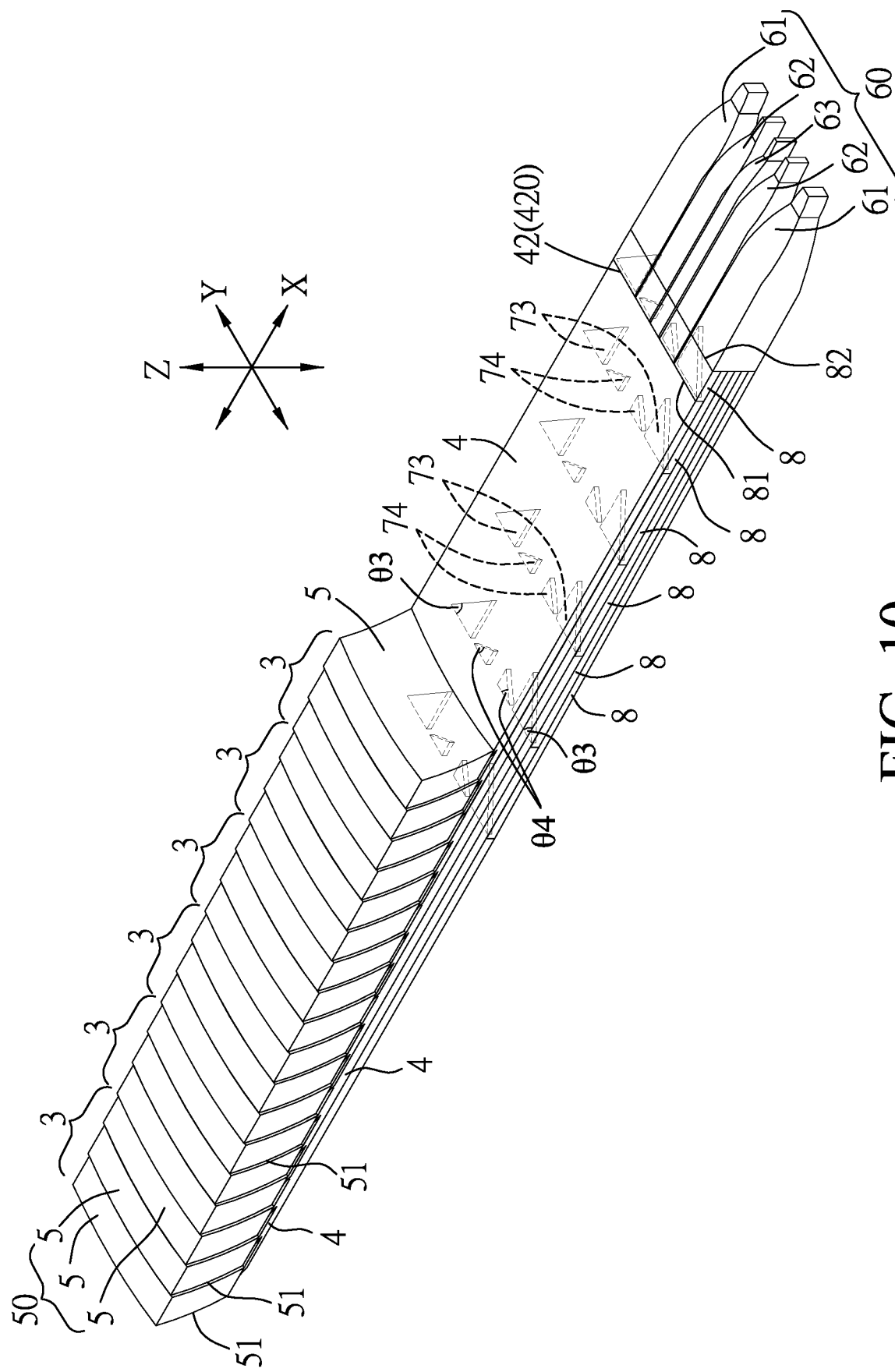
FIG. 10 is a perspective view of a third embodiment of a planar solar concentrator according to the disclosure.
Figure 11:
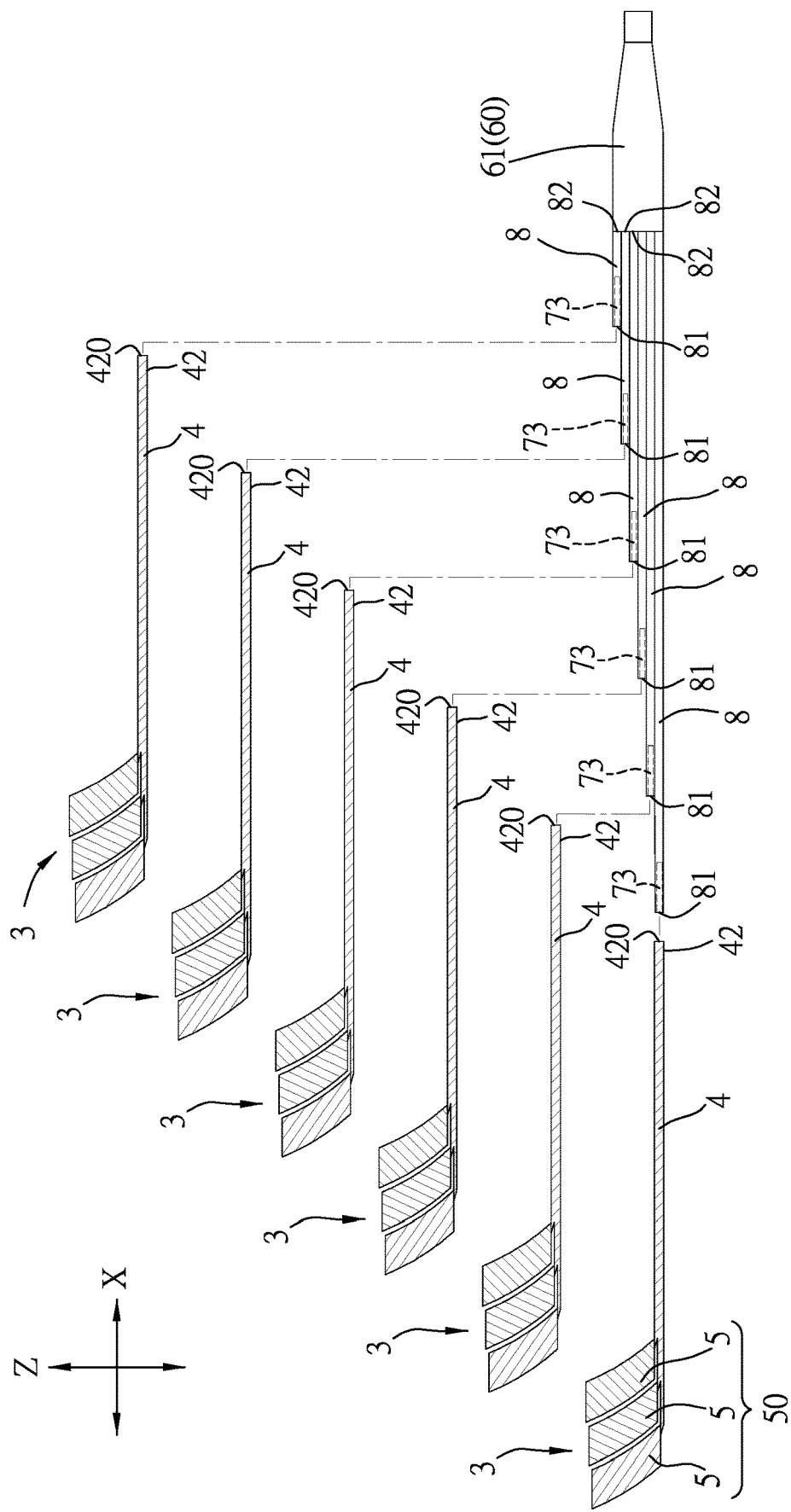
FIG. 11 is a partially exploded, partially cross-sectional view of the third embodiment.

FIGS. 10 and 11 illustrate a planar solar concentrator according to a third embodiment of the disclosure. The third embodiment is similar to the second embodiment except that, in the third embodiment, the planar solar concentrator includes a plurality of the light collecting assemblies 3 stacked in the upright direction (Z) such that an upper one of the light collecting assemblies 3 is disposed on the waveguide slab 4 of a lower one of the light collecting assemblies 3. The planar solar concentrator further includes a plurality of coupling members 8. Each of the coupling members 8 has a front end 81 which is slidably coupled to the rear end surface 420 of the waveguide slab 4 of a respective one of the light collecting assemblies 3, and a rear end 82 which is coupled to slide with the light condensing unit 60 so as to permit the incident light (L, L1, L2) from the respective light collecting assembly 3 to be introduced into the light condensing unit 60. The coupling members 8 have different lengths in the longitudinal directions (X) such that the rear ends 82 of the coupling members 8 are flush with each other.

While the number of the light collecting assemblies 3 in an embodiment shown in FIGS. 10 and 11 is six, the number of the light collecting assemblies 3 may be varied based on requirement.

In an embodiment shown in FIG. 10, the light condensing unit 60 includes two of the first light condensers 61, two of the second light condensers 62, and one of the third light condensers 63, and has a thickness substantially the same as a total thickness of the coupling members 8. The third light condenser 63 is disposed between the second light condensers 62, and the third light condenser 63 and the second light condensers 62 are disposed between the first light condensers 61.

In an embodiment shown in FIGS. 10 and 11, the planar solar concentrator further includes a plurality of third flat prisms 73 and a plurality of fourth flat prisms 74. Each of the third flat prisms 73 is disposed in a respective one of the coupling members 8 in contact with or in proximity to the respective waveguide slab 4, and each of which corresponds in position to a corresponding one of the first light condensers 61. Each of the fourth flat prisms 74 is disposed in the respective coupling members 8 in contact with or in proximity to the respective waveguide slab 4, and each of which corresponds in position to a corresponding one of the second light condensers 62. In this embodiment, each of the third and fourth flat prisms 73, 74 is in contact with the respective waveguide slab 4. Furthermore, the third flat prism 73 has a prism angle θ3 of 48° and the fourth flat prism 74 has a prism angle θ4 of 33°. The third and fourth flat prisms 73, 74 may be made of sapphire.

Figure 12:
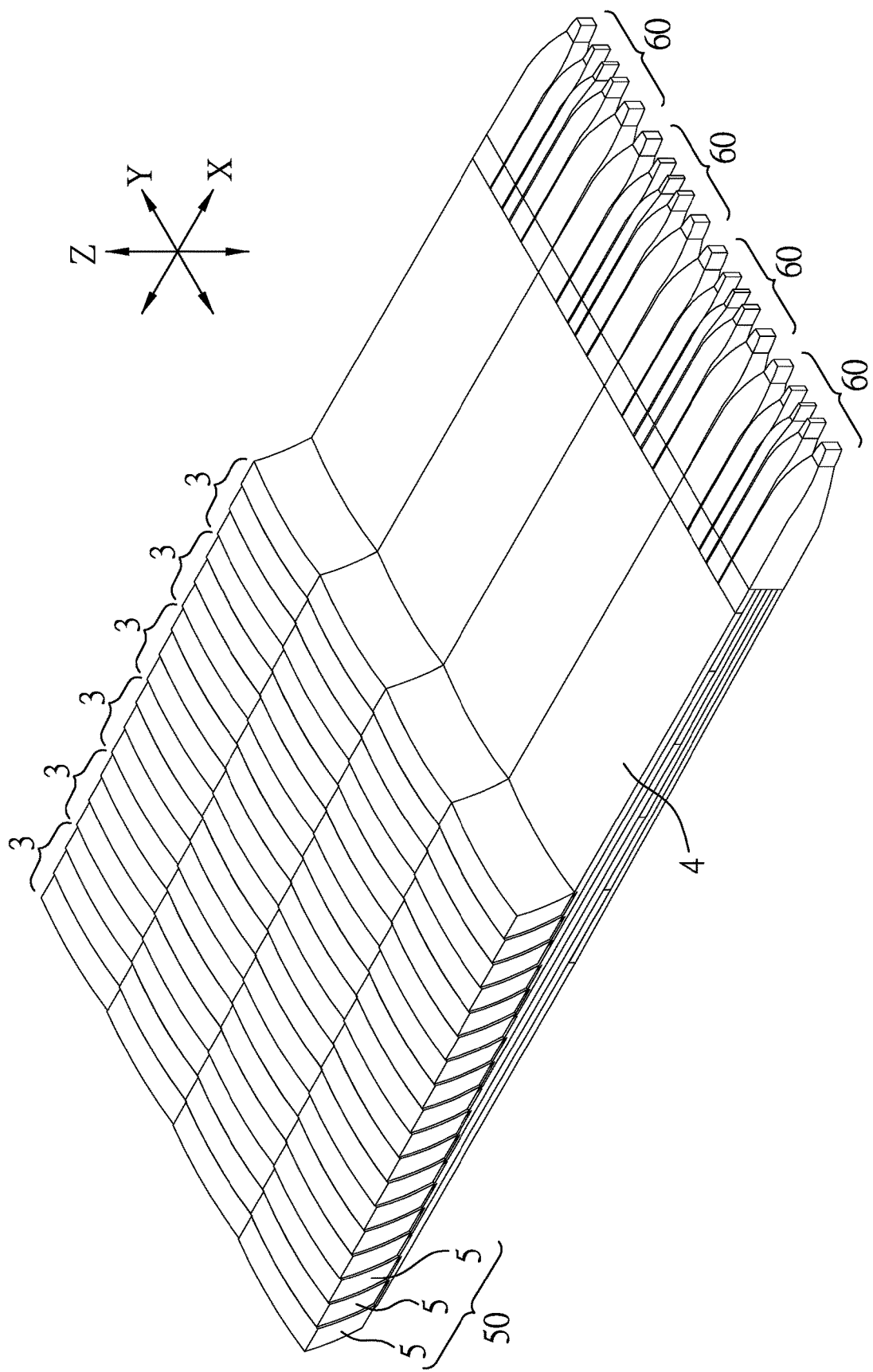
FIG. 12 is a perspective view illustrating four of the planar solar concentrators shown in FIG. 10 being juxtaposed.

In an embodiment shown in FIG. 12, four of the planar solar concentrators shown in FIG. 10 are juxtaposed in the transverse direction (Y). In other embodiments, two, three, five, or more of the planar solar concentrators may be juxtaposed based on requirements.

Figure 13:
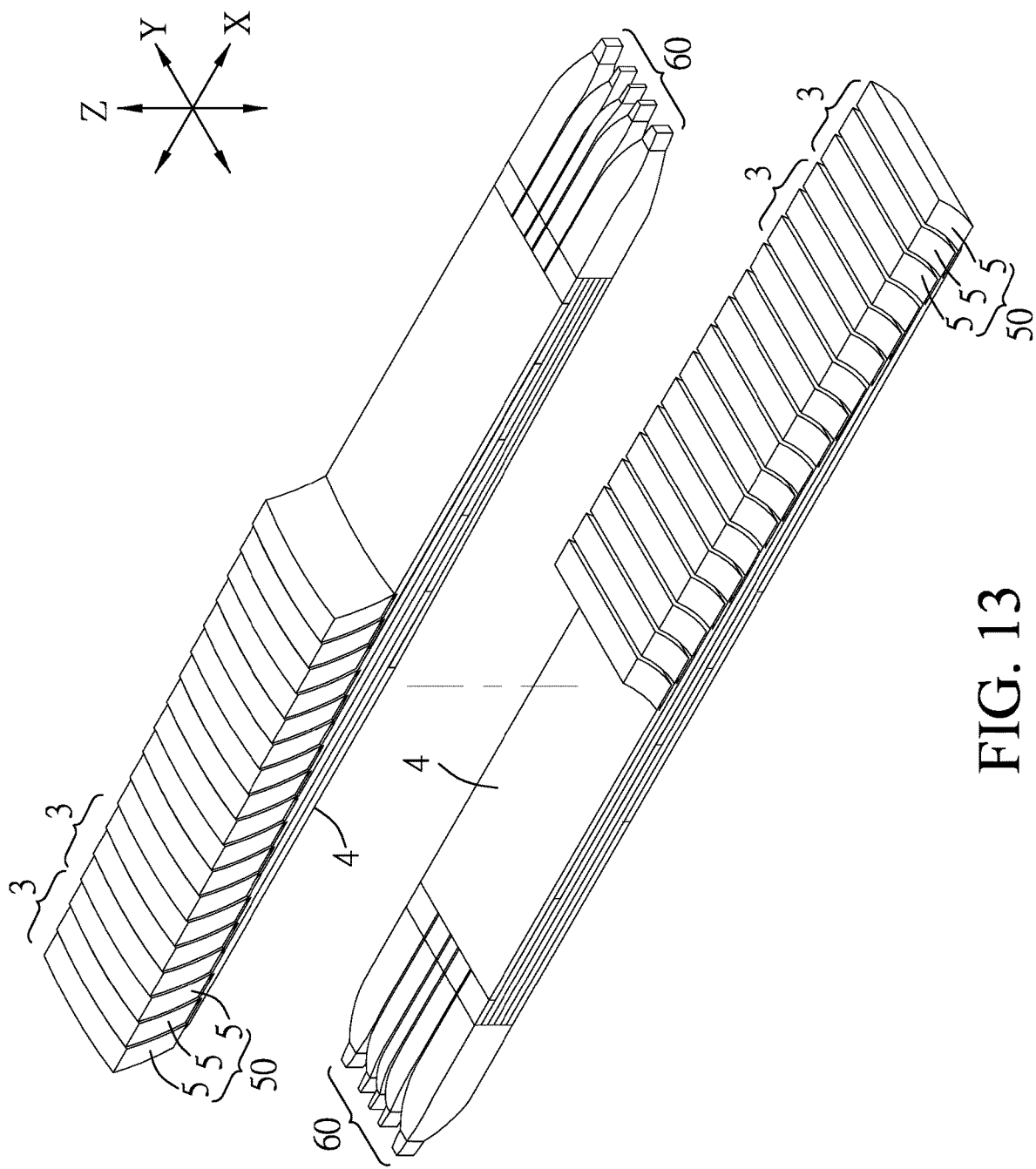
FIG. 13 is a partially exploded perspective view illustrating two of the planar solar concentrators shown in FIG. 10, which are inversely arranged in a longitudinal direction, disposed upon one another.

Further, as shown in FIG. 13, two of the planar solar concentrators shown in FIG. 10, which are inversely arranged in the longitudinal direction (X), are disposed upon one another such that the light condensing unit 60 and the coupling members 8 of the upper one of the planar solar concentrators are disposed above the light collecting units 50 of the lower one of the planar solar concentrators, while the waveguide slabs 4 and the light condensing unit 60 of the lower one of the planar solar concentrators are disposed beneath the light collecting units 50 of the upper one of the planar solar concentrators.

In this embodiment, the light collecting units 50 of the light collecting assemblies 3 of each planar solar concentrator cooperatively define a half length of the planar solar concentrator in the longitudinal direction (X). By arranging the two planar solar concentrators in the upright direction (Z), as shown in FIG. 13, the solar light passing through the light condensing unit 60 and the coupling members 8 of the upper one of the planar solar concentrators may be collected by the light collecting units 50 of the lower one of the planar solar concentrators. As such, the solar light maybe collected in a more efficient way.

In the above embodiments, in order to minimize reflection loss, optical adhesive with optical properties compatible with that of the planar solar concentrator of the disclosure may be used to eliminate air trapped inbetween the joints of the pieces.

In sum, the curved surface 51 of the light collector 5 is configured to reflect an incident light (L, L1, L2) and direct the incident light (L, L1, L2) into the waveguide slab 4, where the incident light (L, L1, L2) is focused at the rear end segment 42 of the waveguide slab 4. Further, the light condensing unit 60 is slidably coupled to the rear end segment 42 of the waveguide slab 4, and is configured for condensing the incident light (L, L1, L2) from the waveguide slab 4. Because the light condensing unit 60 is driven to slide in the transverse direction (Y) in response to a variation of the sun elevation angle, the planar solar concentrator of this disclosure is useful for collecting the solar light in a more efficient way.

In the description above, for the purposes of explanation, numerous specific details have been set forth in order to provide a thorough understanding of the embodiment (s). It will be apparent, however, to one skilled in the art, that one or more other embodiments may be practiced without some of these specific details. It should be also appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A planar solar concentrator comprising:
    a light collecting assembly including
        a light collecting unit including a light collector which has an input surface that is for receiving an incident light from a light source, an output surface that is opposite to said input surface in an upright direction, and a curved surface that extends to interconnect said input and output surfaces, and that has a curvature to direct the incident light toward a collecting zone on said output surface, and
        a waveguide slab extending in a longitudinal direction to terminate at a rear end segment and a front end segment which is coupled to said collecting zone so as to permit the incident light to be introduced into said waveguide slab, said waveguide slab being configured to permit the incident light from said light collector to be directed toward a rear end surface of said rear end segment, said waveguide slab further extending in a transverse direction relative to the longitudinal direction; and
    a light condensing unit which is slidably coupled to said rear end surface, and which is configured for condensing the incident light from said waveguide slab, said light condensing unit being coupled such that based on an elevation angle of the light source, said light condensing unit is permitted to be driven to slide in the transverse direction.

2. The planar solar concentrator according to claim 1, wherein said front end segment has a front end surface which is inclined relative to the upright direction.

3. The planar solar concentrator according to claim 2, wherein said curved surface is disposed forwardly of said front end segment.

4. The planar solar concentrator according to claim 1, wherein
    said front end segment includes a plurality of first regions which are displaced from each other in the longitudinal direction, and which are forwardly and downwardly stepped, each of said first regions having a front end surface which is inclined relative to the upright direction; and
    said light collecting unit includes a plurality of said light collectors, said collecting zones of said output surfaces of said light collectors being respectively coupled to said first regions of said front end segment so as to permit the incident lights entering said light collectors to be introduced into said waveguide slab.

5. The planar solar concentrator according to claim 4, wherein said curved surface of each of said light collectors is disposed forwardly of a respective one of said first regions.

6. The planar solar concentrator according to claim 1, wherein said light condensing unit includes a plurality of light condensers which are displaced from each other in the transverse direction, and which have different widths in the transverse direction.

7. The planar solar concentrator according to claim 6, wherein each of light condensers is tapered rearwardly.

8. The planar solar concentrator according to claim 1, wherein said light condensing unit includes a first light condenser, a second light condenser, and a third light condenser which are displaced from each other in the transverse direction, and which have first, second, third widths in the transverse direction, respectively, the second width being smaller than the first width, the third width being smaller than the second width.

9. The planar solar concentrator according to claim 8, further comprising a first flat prism and a second flat prism, which are respectively disposed inside said first and second light condensers in contact with or in proximity to said rear end surface, and which are configured to direct the incident light from said waveguide slab toward rear ends of said first and second light condensers, respectively.

10. The planar solar concentrator according to claim 8, which comprises a plurality of said light collecting assemblies stacked in the upright direction such that an upper one of said light collecting assemblies is disposed on said waveguide slab of a lower one of said light collecting assemblies, said planar solar concentrator further comprising a plurality of coupling members each having a front end which is slidably coupled to said rear end surface of said waveguide slab of a respective one of said light collecting assemblies, and a rear end which is coupled to slide with said light condensing unit so as to permit the incident light from said respective light collecting assembly to be introduced into said light condensing unit, said coupling members having different lengths in the longitudinal directions such that said rear ends of said coupling members are flush with each other.

11. The planar solar concentrator according to claim 10, further comprising
    a plurality of third flat prisms each of which is disposed in a respective one of said coupling members in contact with or in proximity to said respective waveguide slab, and each of which corresponds in position to said first light condenser, and
    a plurality of fourth flat prisms each of which is disposed in said respective coupling members in contact with or in proximity to said respective waveguide slab, and each of which corresponds in position to said second light condenser.

* * * * *